(12) United States Patent
Egbertson et al.

(10) Patent No.: US 8,762,110 B2
(45) Date of Patent: Jun. 24, 2014

(54) INTERACTIVE TRUSS OBJECTS IN COMPUTER-AIDED DESIGN MODELS

(75) Inventors: Erik Egbertson, Medford, MA (US); Alexandra Varsanofieva, Malden, MA (US)

(73) Assignee: Autodesk, Inc., San Rafael, CA (US)

( * ) Notice: Subject to any disclaimer, the term of this patent is extended or adjusted under 35 U.S.C. 154(b) by 1351 days.

(21) Appl. No.: 11/696,070

(22) Filed: Apr. 3, 2007

(65) Prior Publication Data

US 2008/0249749 A1 Oct. 9, 2008

(51) Int. Cl.
G06F 17/50 (2006.01)
G06G 7/48 (2006.01)
G06F 19/00 (2011.01)
G06T 15/00 (2011.01)
G09G 5/00 (2006.01)
E04C 3/02 (2006.01)
E04C 3/30 (2006.01)
E04H 12/00 (2006.01)

(52) U.S. Cl.
USPC ............ 703/1; 703/6; 703/7; 700/97; 700/98; 345/419; 345/629; 52/690; 52/691; 52/692

(58) Field of Classification Search
USPC ........... 703/1, 6, 7; 700/97, 98; 345/419, 629; 52/690–692
See application file for complete search history.

(56) References Cited

U.S. PATENT DOCUMENTS

| | | | |
|---|---|---|---|
| 4,964,060 A * | 10/1990 | Hartsog | 703/1 |
| 6,931,364 B1 * | 8/2005 | Anturna | 703/1 |
| 7,010,472 B1 * | 3/2006 | Vasey-Glandon et al. | 703/6 |
| 7,043,408 B2 * | 5/2006 | Camiener et al. | 703/1 |
| 2006/0195303 A1 * | 8/2006 | Thompson et al. | 703/1 |
| 2006/0208169 A1 | 9/2006 | Breed et al. | |

OTHER PUBLICATIONS

Angran Xiao, Hae-Jin Choi, Rahul Kulkarni, Janet K. Allen, David Rosen, and Farrokh Mistree, "A Web-Based Distributed Product Realization Environment", ASME 2001, Design Engineering Technical Conference and Computer and Information in Engineering Conference.*
"Build a Model of a Truss Bridge", Learning Activity 1, 2001.*
"Design and Build a Model Truss Bridge", Learning Activity 5, 2001.*
"AutoCAD Architectural Desktop", Release 2, User guide, 1999.*
Autodesk, NPL, "Metric Tutorials, Autodesk Revit Structure 4", Jul. 2006.*
Hongqing Wang, NPL, "computer aided design methods for additive fabrication of truss structures", Oct. 2002 (google).*
Jeffrey Smith, NPL, "Creating Models of Truss Structures with optimization", Jul. 2002 (Google).*
Learning Activity #4, NPL, "Learding activity # 4: Design a Truss Bridge with a computer", Aug. 2003 (google).*
PCT Search Report, PCT/US08/59265, dated Jun. 4, 2009.

* cited by examiner

*Primary Examiner* — Saif Alhija
*Assistant Examiner* — Angel Calle
(74) *Attorney, Agent, or Firm* — Patterson & Sheridan, LLP (57) ABSTRACT

Embodiments of the invention provide a computer-aided design (CAD) application configured for generating interactive truss objects in a CAD model. In one embodiment, a truss creation tool allows the user to select a truss family and the endpoints of the truss. Based on these selections, the truss creation tool generates a layout and structural members of a truss. The truss may be maintained as an interactive object within the CAD model. Thus, a user may edit the truss object, resulting in the regeneration of the truss layout and the regeneration of the structural elements of the truss.

28 Claims, 8 Drawing Sheets

INTERACTIVE TRUSS OBJECTS IN COMPUTER-AIDED DESIGN MODELS

BACKGROUND OF THE INVENTION

1. Field of the Invention

The present invention generally relates to computer software. More specifically, the present invention relates to techniques for providing interactive truss objects in computer-aided design models.

2. Description of the Related Art

The term computer-aided design (CAD) generally refers to a broad variety of computer-based tools used by architects, engineers, and other construction and design professionals. CAD applications may be used to construct computer models representing virtually any real-world construct. Commonly, CAD applications are used to compose computer models and drawings related to construction projects. For example, a CAD application may be used to compose a 3D model of a house or an office building. Once composed, these CAD models are often used to generate a variety of two-dimensional (2D) and 3D views such as plan, profile, section, and elevation views. Additionally, such models may be used to generate architectural, construction, engineering, and other documentation related to the construction project.

A common feature in an architectural plan is a truss. A truss is constructed from structural framing elements arranged in a pattern to work together at providing support over a span larger than possible if placed individually. Trusses often take the form of common patterns that are known in the industry by the names of the engineers that first developed them (e.g., a Howe truss, a Pratt truss, to name a couple examples).

A common truss includes two relatively horizontal members, one positioned above the other. These members are referred to as a top chord and a bottom chord, respectively. In addition, a truss also typically includes multiple members connecting the top and bottom chords, referred to as webs. A web may be diagonal, generally meaning the web is placed at a slanted angle to connect it with the top and bottom chords, or a web may be vertical, generally meaning it is placed at a right-angle to the bottom chord.

Conventionally, modeling a truss in a CAD model has been accomplished by manually arranging multiple structural members to form the truss or using a specialized program (i.e., a "wizard") to generate the structural members. A wizard may be configured to generate a set of structural members and insert them into a CAD model on behalf of the user. However, the multiple structural members only provide a set of independent drawing elements within the CAD model. Thus, if a user desires to modify the CAD model of the truss or truss properties, or if the CAD model is changed in a way that requires that the drawing elements representing the truss to be modified, then the user must either manually edit the structural members that make up the truss or create a new set of structural members using the wizard. Thus, these approaches require significant effort from the user to create and modify trusses in CAD models Accordingly, as the foregoing discussion demonstrates, there remains a need in the art for a more efficient way to define and manipulate truss elements in CAD models.

SUMMARY OF THE INVENTION

Embodiments of the invention include a method for generating a truss object for a computer-aided design (CAD) model. The method generally includes receiving a selection of a truss family for the truss object and receiving a selection of a beginning point and an ending point at which to place the truss object within the CAD model. The method also includes generating a layout for the truss object and generating a plurality of structural members to represent physical components of the truss object within the CAD model. The layout may define a pattern for the truss object, based on the truss family and the beginning and ending points. Also, the plurality of structural members may be positioned within the CAD model according to the layout generated for the truss object. The method also includes associating the truss layout and the plurality of structural members with the truss object and storing the truss object in the CAD model.

In a particular embodiment, the plurality of structural members may include drawing objects representing a top chord, a bottom chord, one or more vertical members and one or more diagonal members. Additionally, the CAD application may be configured to allow users to select a truss layout from many known, or custom, truss families. For example, the truss family may specify a general layout for a Howe truss, a Pratt truss, or another well-known truss configuration to use in generating a particular instance of a truss object within a CAD model.

Advantageously, a user may interact with a CAD application to modify the instance of the truss object within the CAD model, the properties of the truss family used to generate the truss object, or elements of the CAD model associated with the truss object. For example, a truss object may have a height, a length, a position, and an orientation of the truss object within the CAD model. Similarly, a truss family may specify a general pattern for truss objects generated based upon that family, as well proprieties such as a height, length, construction materials, or other properties for the truss objects generated based upon that family. Each of these properties may be edited by the user for a particular truss object within the CAD model. In a particular embodiment, the truss may be attached to a roof object of the CAD model, such that the top chord of the truss conforms to the shape of the roof, and the truss layout is modified so that a top chord of the truss is attached to the bottom of the roof within the CAD model.

In response, the CAD application may be configured to regenerate the truss layout and the structural elements of the truss object. Thus, the truss object may respond to changes in the CAD model without requiring the user to redraw the structural members individually or requiring the user to remove structural members of the truss object and manually create a new set of structural members.

DETAILED DESCRIPTION OF THE PREFERRED EMBODIMENTS

Embodiments of the invention provide a computer-aided design (CAD) application configured to generate and maintain interactive truss objects in a CAD model. In one embodiment, a truss creation tool allows a user to select a truss family and the endpoints of a truss to be generated. Based on these selections, the truss creation tool generates a layout and set of structural members for an instance of a truss object. The CAD application may be further configured to maintain the truss as an interactive object in the CAD model. For example, when the user modifies parameters of the truss object (e.g., changes the height associated with a truss of a given type), the CAD application may be configured to regenerate the layout and structural elements of instance of that truss family in the CAD model. Additionally, the endpoints of the truss may be attached to other drawing elements of the CAD model, such that changes to the attached objects cause the CAD application to re-generate the structural members of the truss, according to the truss layout associated with that truss. For example, a truss may be positioned to rest upon a column at each end, in such a case, if the positions of the columns in the CAD model are modified, then the truss may be updated to reflect this change. Similarly, a truss object may be attached to a roof object of the CAD model, such that the top chord of the truss conforms to the geometry of the roof.

Figure 1:
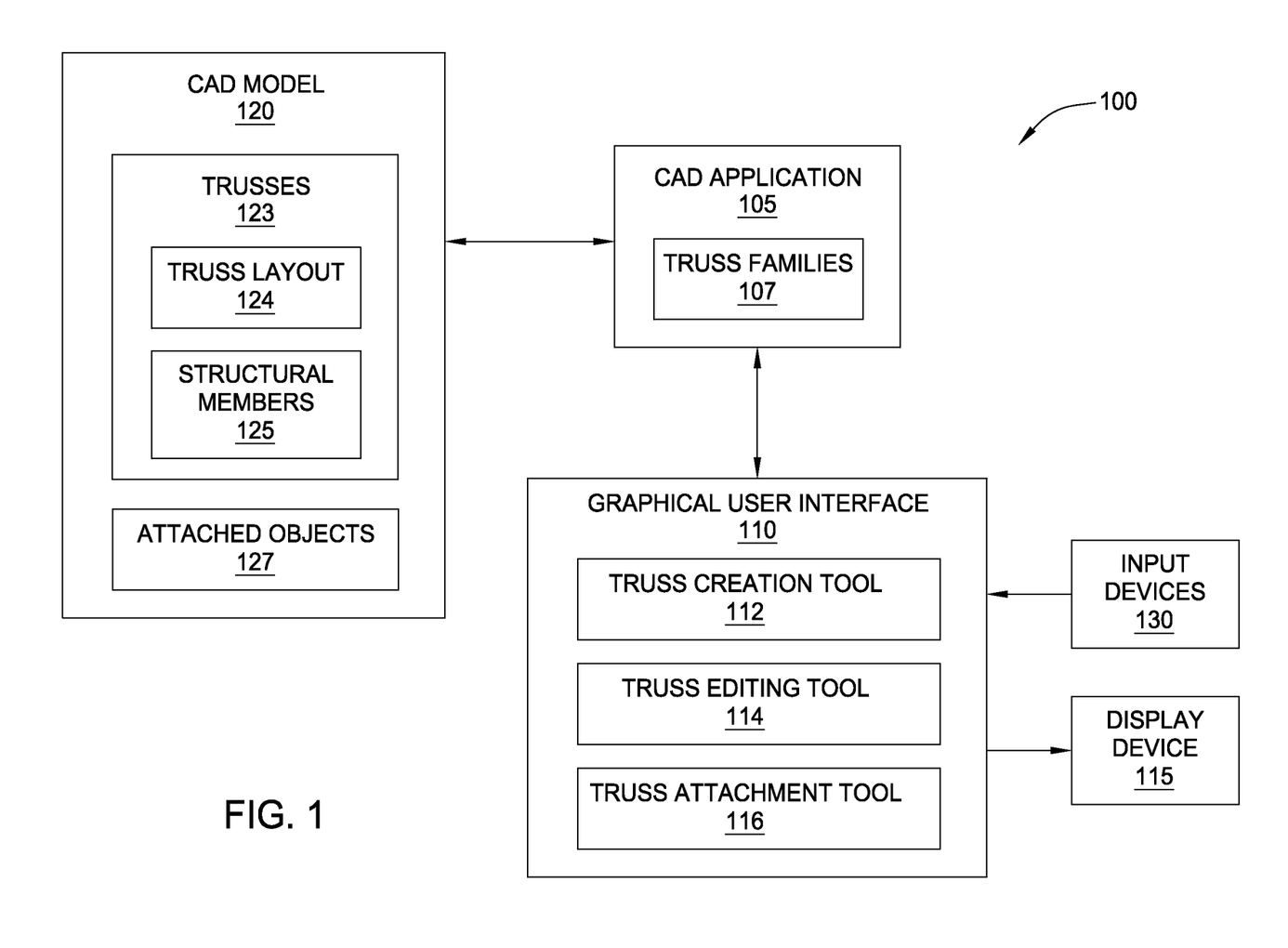
FIG. 1 is a block diagram illustrating a computer system configured to provide interactive truss objects in a CAD model, according to one embodiment of the invention.

FIG. 1 is a block diagram illustrating a computer system 100 configured to provide interactive truss objects in a CAD model, according to one embodiment of the invention. The components illustrated in system 100 are included to be representative of computer software applications executing on existing computer systems, e.g., desktop computers, server computers, laptop computers, tablet computers, and the like. Of course, the software applications described herein are not limited to any particular computing system and may be adapted to take advantage of new computing systems as they become available.

Additionally, the components illustrated in system 100 may be implemented as software applications that execute on a single computer system or on distributed systems communicating over computer networks such as local area networks or large, wide area networks, such as the Internet. For example, system 100 may include a graphical user interface (GUI) 110 executing on a client computer system at one physical location communicating with a CAD application 105 at another physical location. Of course CAD application 105 and GUI 110 may be integrated as a single software application. Also, CAD application 105 and GUI 110 may be provided as an application program (or programs) stored on computer readable media such as a CD-ROM, DVD-ROM, flash memory module, or other tangible storage media.

As shown, system 100 includes, without limitation, CAD application 105, GUI 110, a CAD model 120, a set of display devices 115, and a set of input devices 130. CAD application 105 may be any software application used to compose computer-based drawings. For example, CAD application 105 may be the AutoCAD® drawing program from Autodesk, Inc. GUI 110 provides users with a graphical interface to the functions and features of CAD application 105. As shown, GUI 110 includes a truss creation tool 112, a truss editing tool 114, and a truss attachment tool 116. In addition, GUI 110 may include any combination of graphical elements such as windows, menus buttons, ribbons, dialog boxes, etc. User input devices 130 typically include a mouse and a keyboard, and display devices 115 may include LCD or CRT displays. One of ordinary skill in the art will recognize, however, that the elements of CAD application 105 and GUI 110 shown in FIG. 1 have been simplified to highlight features of the present invention and that a typical CAD application 105 and GUI 110 may include a variety of additional elements and/or components.

Figure 2:
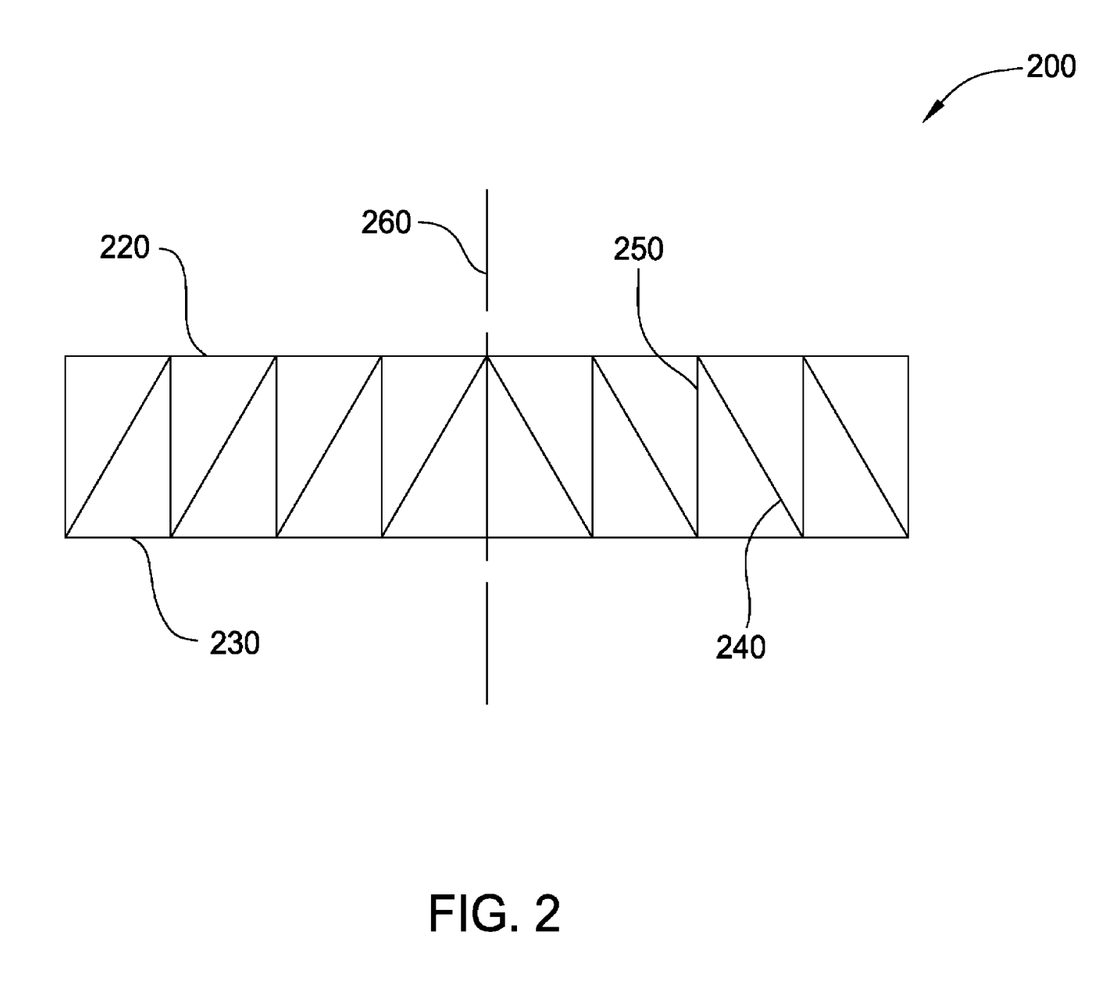
FIG. 2 illustrates a conceptual representation of a truss family, according to one embodiment of the invention.

Also as shown, CAD application 105 includes a set of truss families 107. In one embodiment, each truss family 107 may describe a type of truss that is known in the art (e.g., a Howe truss, a Pratt truss, a Warren truss, a Fink truss, or a Gambrel truss, to name a few well-known examples). A truss family may be defined by an overall geometry and arrangement of the component parts that make up that family. Generally, each truss family 107 is suited for certain uses and situations. In one embodiment, truss families 107 may be used as patterns for creating truss objects in CAD model 120. For example, FIG. 2 illustrates a conceptual representation of a particular truss family 200, according to one embodiment of the invention. Illustratively, truss family 200 includes a top chord 220 and a bottom chord 230, with the two chords connected by a set of diagonal webs 240 and a set of vertical webs 250. In addition, truss family 200 includes a centerline 260 representing the axis around which the geometry of this truss is oriented. The truss family 200 illustrated in this example is a Howe flat truss, characterized by the orientation and symmetry of diagonal webs 240. In this example, truss family 200 is horizontally symmetrical, and thus, centerline 260 is located in the center of the horizontal length of truss family 200. However, in cases where truss a given truss family is not horizontally symmetrical, the centerline may be located at other points along that truss.

Referring again to FIG. 1, CAD model 120 includes one or more trusses 123, each including a truss layout 124 and a set of structural members 125. In one embodiment, truss layout 124 is generated using a specific truss family 107 and provides the geometry and dimensions of a particular truss within CAD model 120. That is, truss layout 124 may be generated based on one of truss families 107 and the positions and/or geometry of other elements of CAD model 120, such as an attachment point or a roof structure. Generally, truss layout 124 may be based on the length of truss 123 as well as a position of a centerline 260 used to generate truss 123. As shown, each truss 123 may also include a set of structural members 125. In one embodiment, structural members 125 may include drawing elements or objects that represent real items used in architecture and construction (e.g., I-beams, columns, etc.), rather than a collection of more simple CAD drawing elements such as points, lines, and curves. That is, structural members 125 may provide drawing elements having a position, geometry, and shape that model the physical beams and other components used to construct a real-world version of trusses 123 included in CAD model 120.

In one embodiment, each truss family 107 may also include a set of properties that may be specified by a user. Such properties may include, for example, default dimensions, default panel width, default panel quantity, specifications of materials, and the like. For example, setting a "height" property for a truss family 107 may cause all trusses 123 generated from that truss family 107 to have the specified height dimension. Additionally, a user may specify properties that apply to individual trusses 123 (hereafter "instance properties"). The instance properties specified for a particular truss 123 may override the properties specified for the corresponding truss family 107. For example, a user may edit the height of a particular truss 123 without changing the height property specified for the truss family 107 upon which that truss 123 is based.

In one embodiment, truss creation tool 112 may be used to generate a truss 123 in CAD model 120. Initially, a user may select a truss family 107 along with the endpoints (i.e., the two horizontal ends) of the truss 123. The truss creation tool 112 may be configured to use these selections to generate truss layout 124 and structural members 125 defining an instance of truss 123 for CAD model 120. Truss editing tool 114 may be used to modify the truss 123 in CAD model 120. That is, a user may edit parameters that define properties of the truss layout 124 and structural members 125 in order to modify a given truss 123.

As is known in the art, in a typical architectural design, trusses are used as components in larger structures, and are usually connected to other components. Thus, in one embodiment, CAD model 120 may also include a set of attached objects 127, representing drawing elements or objects of CAD model 120 to which trusses 123 are attached. The attached objects 127 may include beams, columns, walls, roofs, and the like. Further, the endpoint attachments between truss 123 and attached objects 127 may be persistent in the CAD model 120. That is, if a user modifies the geometry, position, or shape of one of the attached objects 127, then CAD application 105 may be configured to modify the truss 123 to maintain the attachment. For example, the truss layout 124 and structural members 125 may be updated to maintain an attachment between the positions of supporting columns and the embodiments of 123 in CAD model 120. In such a case, a new truss object may be generated based on the truss family associated with that truss and the modified elements of CAD model 120.

Figure 3A:
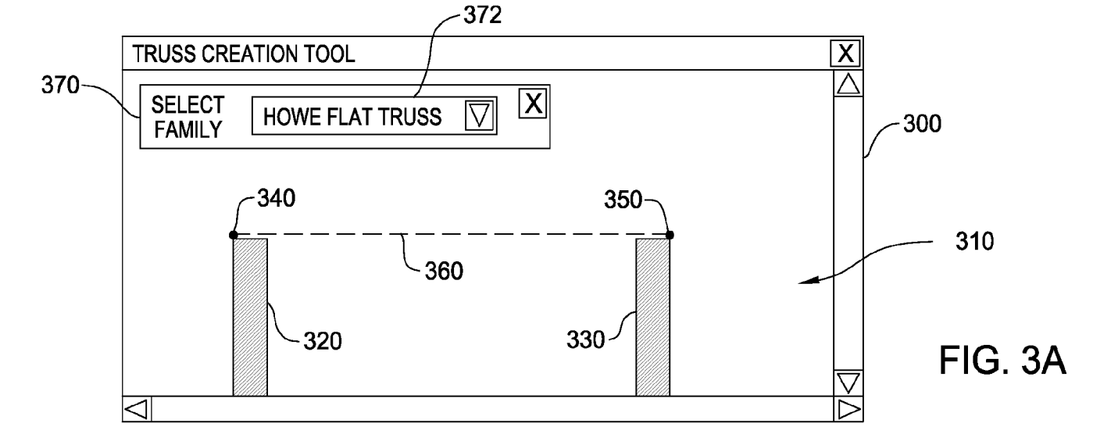
FIGS. 3A-3B illustrate a screen display of a CAD application being used to generate a truss, according to one embodiment of the invention.

FIG. 3A illustrates a screen display 300 of CAD application 105 being used to generate an instance of a truss in a CAD model, according to one embodiment of the invention. More specifically, the screen display 300 provides an example of truss creation tool 112. Illustratively, screen display 300 includes a truss family selection dialog box 370 and an elevation view 310. The truss family selection dialog box 370 includes a pull-down menu 372, in which a user may select one of truss families 107. Of course, other graphical interface constructs may be used. As stated, a selected truss family 107 may provide a pattern for generating truss layout 124 within CAD model 120. In this example, the user has selected a "HOWE FLAT TRUSS" from truss families 107. As shown, elevation view 310 includes a left column 320 and a right column 330. In this illustration, a user of truss creation tool 112 has selected a first endpoint 340, which is attached to the top of left column 320. In addition, the user has selected a second endpoint 350, which is attached to the top of right column 330. As a result, truss creation tool 112 has generated a dashed line 360, illustrating the length and general position of the truss to be created. In addition to specifying columns, a user may specify the geometry for the top chord and/or bottom chord of the truss. For example, a user may specify geometry for a roof line with one or more peaks, or a curved roofline. In response, CAD application 105 may be configured to generate the appropriate truss based on the geometry of the top and bottom chord and selected truss family.

Figure 3B:
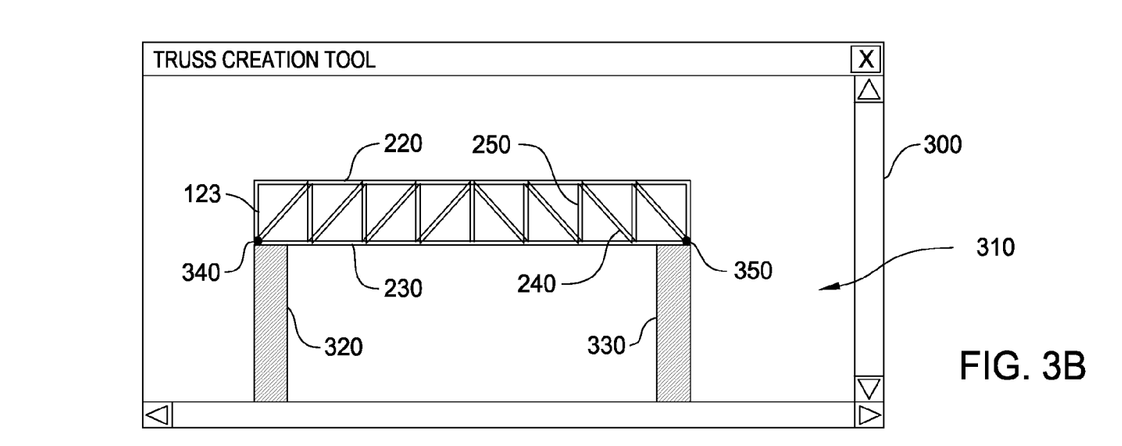

FIG. 3B illustrates the results of the truss generated from the user selections illustrated in FIG. 3A. As shown in FIG. 3B, truss 123 has been generated and placed above columns 320 and 330. Truss 123 is positioned at the location marked in FIG. 3A by dashed line 360. Illustratively, truss 123 includes structural members 125. Specifically, in this case, structural members 125 include drawing elements representing a top chord 220, a bottom chord 230, a set of vertical webs 250, and a set of diagonal webs 240. These drawing elements are arranged as specified by the selected truss layout, in this example a Howe flat truss selected in pull-down menu 372. Accordingly, truss 123 includes a flat top-chord, flat bottom chord and a set of panels between the vertical webs 250, each having equal widths over the length of truss 123. Further, diagonal webs 240 each slant towards the center, with panels on the left half slanting downward from left-to-right, and panels on the right half slanting upward from left-to-right, a pattern consistent with the Howe truss family.

Figure 4A:
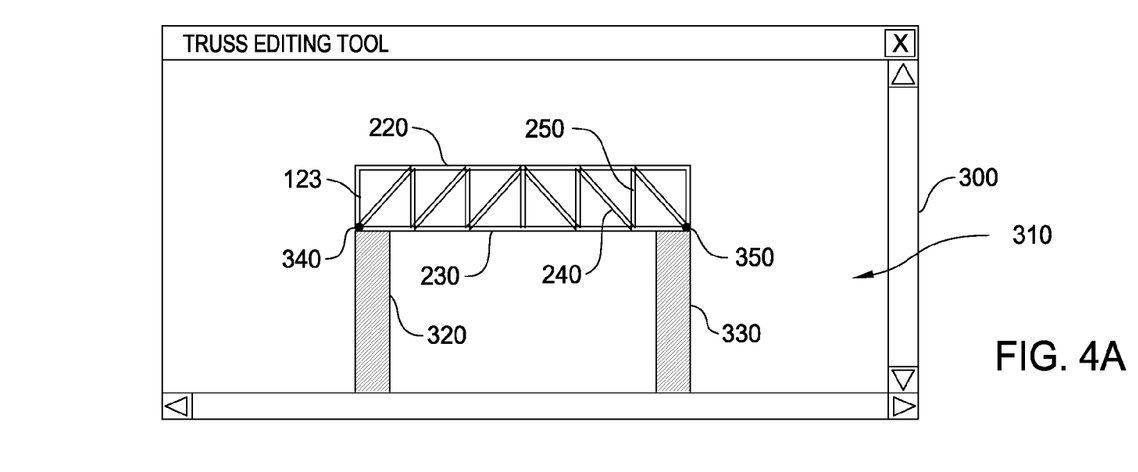
FIGS. 4A-4C illustrate a screen display of a CAD application being used to modify a truss, according to one embodiment of the invention.
Figure 4B:
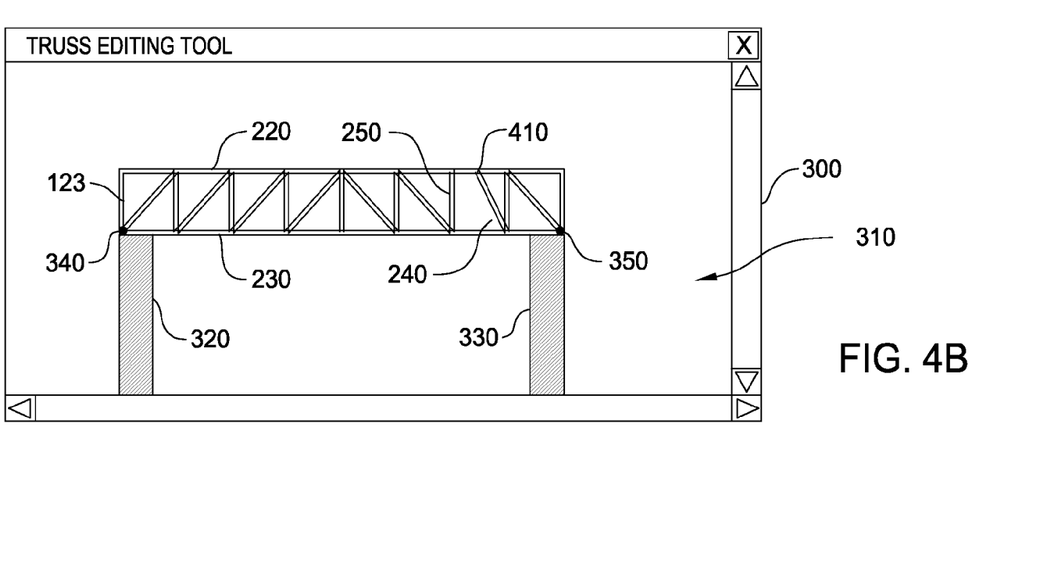
Figure 4C:
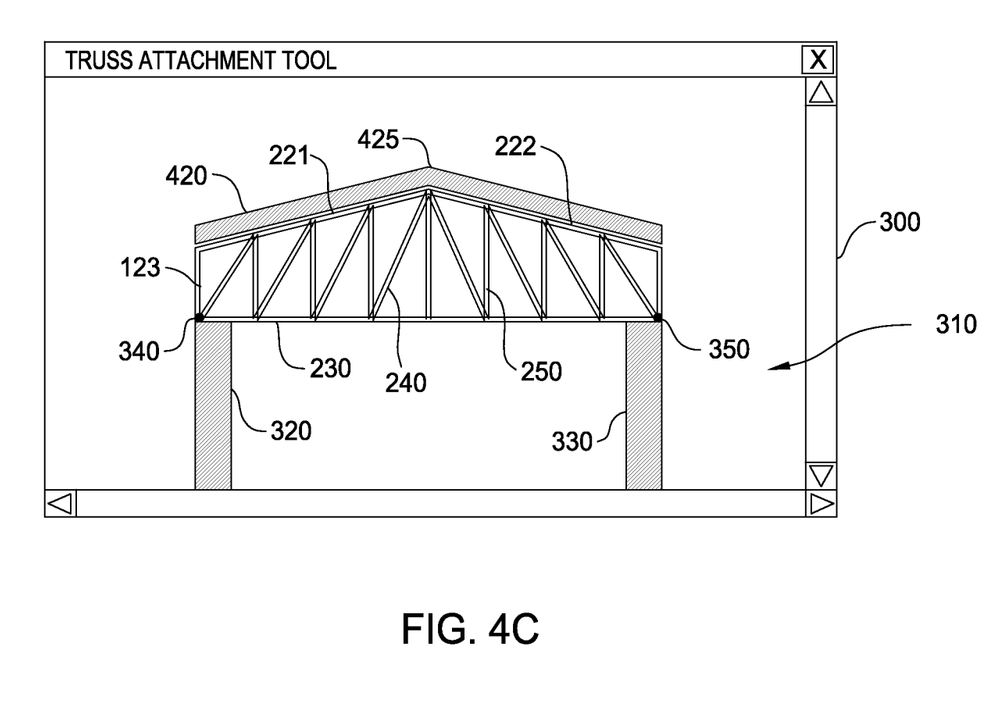

FIGS. 4A-4C illustrate a screen display 300 of CAD application 105 being used to modify an instance of truss 123 in CAD model 120, according to one embodiment of the invention. As shown, screen display 300 includes a similar elevation view 310 to that illustrated in FIGS. 3A-3B.

FIG. 4A illustrates an example of truss editing tool 114 being used to reposition columns 320 and 330 so that they are closer to one another. In this example, truss 123 is modified to maintain the attachment of truss endpoints 340 and 350 to columns 320 and 330. At the same time, even though the length of truss 123 has been reduced, the width of the panels between the vertical webs 250 has not changed. Thus, the number of panels has been reduced to six, rather that the eight panels shown in FIG. 3B. In another embodiment (not shown), changes in length of truss 123 may not affect the number of panels in truss 123, but may instead result in changing the width of the panels to maintain a specific number of panels.

FIG. 4B illustrates an example in which the user has modified one of the structural members 125 created for truss 123, thereby changing the layout 124 for that truss. More specifically, the user has edited the angle of diagonal web 240 such that this diagonal web no longer attaches to vertical web 250, but instead is shorter and attached to top chord 220 at a connection point 410. In one embodiment, changes to the truss layout 124 of truss 123 may be maintained as an instance property associated with a specific one of trusses 123. Thus, such changes may persist in CAD model 120 even if truss 123 is otherwise modified, for example by being made shorter. Further, such changes may serve as overrides, meaning that the changes to truss 123 persist even if the properties of the truss family 107 are modified. At the same time, other instances of a Howe truss within CAD model 120 may not have the modification shown in FIG. 4B.

As stated, truss attachment tool 116 may be used to attach the top chord of truss 123 to the bottom of attached object 127. More specifically, truss attachment tool 116 may be configured to modify the geometry and position of top chord 220 to conform to the bottom surface of attached object 127, as well as to modify the shape and position of structural members 125 to conform to the geometry of attached object 127. For example, attached object 127 may be a drawing elements or objects representing a roof within CAD model 120, but may also be a simpler drawing element such as a line or a curve. Alternatively, users may specify the desired geometry for a top chord and/or a bottom chord for the truss, and truss attachment tool 116 may be configured to generate the appropriate structural members for the chord geometry, and add them to the CAD drawing.

FIG. 4C illustrates an example in which the user has attached truss 123 to a drawing element representing a roof 420, according to one embodiment of the invention. As shown, roof 420 is composed using two straight sections joined at an angle to form a roof peak 425. Consequently, top chord 220 has been split into two sections 221 and 222 that are joined at an angle to match the slope of roof 420. In this example, diagonal webs 240 and vertical webs 250 have been lengthened to so that the modified top chord 220 is in contact with the bottom of roof 420. At the same time, however, the general structure of truss 123 maintains the panel size and diagonal web orientation of the selected truss layout (i.e., of a Howe truss). Additionally, in one embodiment, if attached object 127 (e.g., roof 420) is modified, then CAD application may be configured to alter the layout and structural members of truss 123 so that top chord 220 remains attached. For example, if a user modifies the geometry of roof 420 to have a higher elevation for roof peak 425, then the webs of truss 123 may be altered to maintain the attachment between the truss 123 and the roof 420.

In embodiment, truss attachment tool 116 may be used to attach truss 123 to a non-structural object of the CAD model 120. More specifically, either top chord 220 or bottom chord 230 of truss 123 may be attached to a non-structural object of CAD model 120, for example a line or a spline.

Figure 5:
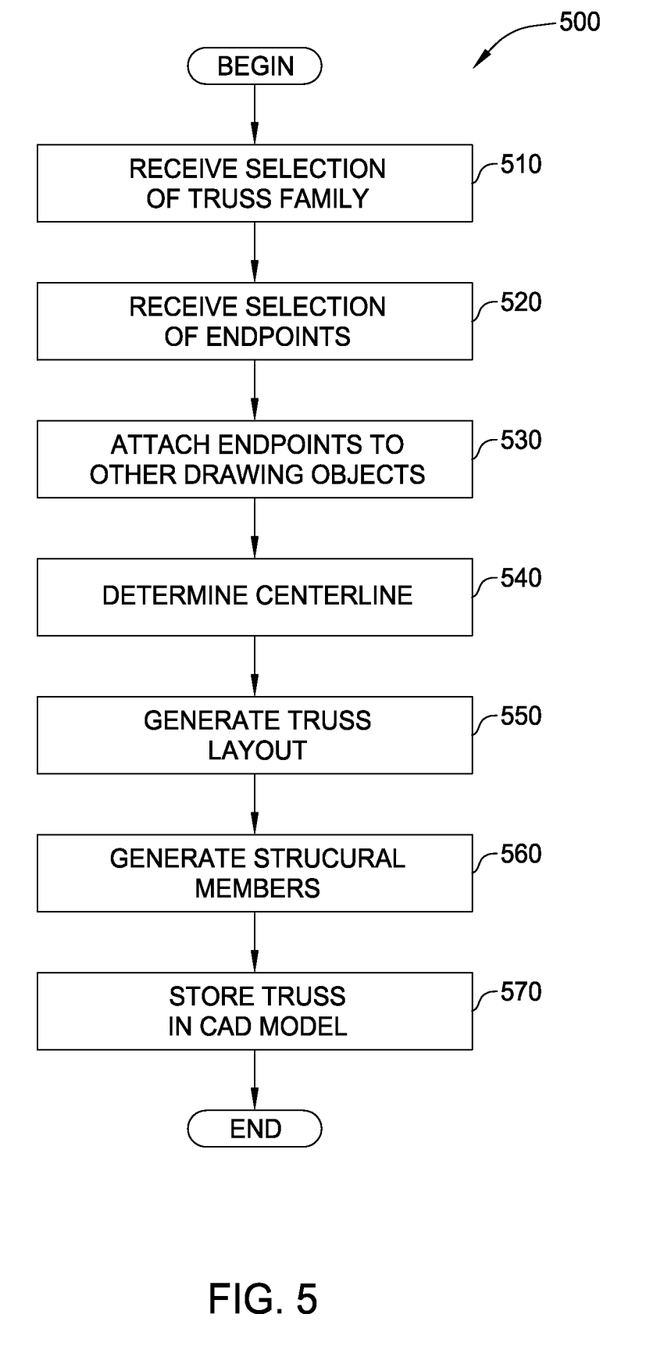
FIG. 5 illustrates a method for generating a truss in a CAD model, according to one embodiment of the invention.

FIG. 5 illustrates a method 500 for generating a truss in a CAD model, according to one embodiment of the invention. Persons skilled in the art will understand that, even though the method is described in conjunction with the systems of FIGS. 1-4, any system configured to perform the steps of method 500, in any order, is within the scope of the present invention.

As shown, method 500 begins at step 510, where a user of CAD application 105 selects a truss family to serve as a pattern for the truss being generated. For example, FIG. 3A illustrates a user interacting with elements of GUI 110 such as the pull-down menu 372 of family selection dialog box 370 to select the desired truss family 107. At step 520, the user may specify a beginning point and an ending endpoint for the truss being generated (e.g., endpoints 340 and 350 of FIG. 3A). In one embodiment, the distance between the endpoints may be used to calculate a length for the truss being generated. At step 530, the user may attach the selected endpoints to other objects of the CAD model (e.g., columns 320 and 330 of FIG. 3A). In one embodiment, the endpoint attachments may be maintained in the CAD model 120 as an instance property of the truss being generated. Of course, other methods of determining the endpoints or truss length are contemplated. For example, the user may select existing elements of CAD model 120, such as columns 320 and 330 of FIG. 3A, and the truss creation tool 112 may be configured to determine the appropriate beginning point and ending point.

At steps 540, 550, and 560, CAD application 105 may be configured to generate an instance of a truss and insert the truss into CAD model 120. In one embodiment, steps 540, 550 and 560 may be performed by truss creation tool 112. At step 540, the centerline of the truss layout is determined. The centerline will be the midpoint of the length of the truss being generated. For example, truss 123 illustrated in FIG. 3B includes a truss centerline at the midpoint between columns 310 and 330. Note, however, the centerline may identify the orientation of the truss layout, and not necessarily the midpoint between the ends of the truss. In some cases, the centerline may be constrained by parameters than the length of the truss being generated. For example, if the width of the panels of a Howe flat truss is fixed for a given truss instance, and the length is not evenly divisible by the panel width, a valid truss layout may have an uneven number of panels. Thus, in such a case, the centerline may be determined to be asymmetrical.

At step 550, the truss creation tool 112 may generate the appropriate truss layout, based on the selected truss family, the length of the truss being generated, and the centerline for the layout. At step 560, truss creation tool 112 may generate a set of structural members according to the layout generated at step 550. For example, structural members 125 may be generated to conform to truss layout 124, resulting in truss 123. At step 570, the instance of truss generated at steps 550 and 560 may stored in CAD model 120.

Figure 6:
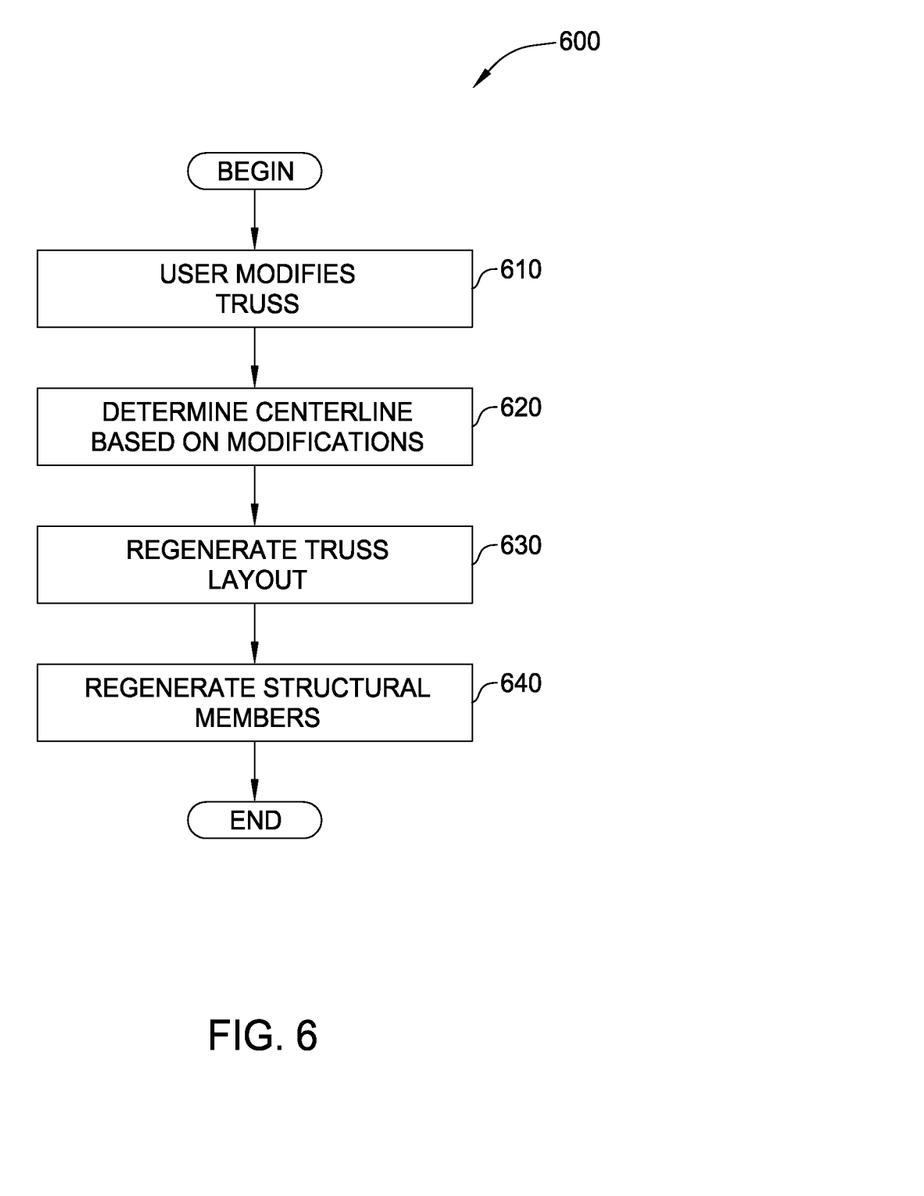
FIG. 6 illustrates a method for modifying a truss of a CAD model, according to one embodiment of the invention.

FIG. 6 illustrates a method 600 for modifying an instance of a truss included in a CAD model, according to one embodiment of the invention. Persons skilled in the art will understand that, even though the method is described in conjunction with the systems of FIGS. 1-4, any system configured to perform the steps of method 600, in any order, is within the scope of the present invention.

As shown, method 600 begins at step 610, where CAD application 105 is used to modify a design parameter for a truss in a CAD model. In one case, the modification made in step 610 may result from a change to the properties of a truss family, which may be propagated to all truss instances in CAD model 120 based on that truss family. For example, the user may increase a distance between top chord 220 and bottom chord 230 specified for instances of a given truss family 107. As another example, the modification made at step 610 may result from a change to the properties of a particular instance of 123 in CAD model 120. For example, as shown in FIG. 4B, the user may edit the geometry or position of one of the structural members that is included in a given truss. In yet another situation, the modification made in step 610 may result from the user editing other objects or drawing elements in CAD model 120 which are attached to a truss. For example, as shown in FIGS. 4A and 4B, the user may change the positions of columns 320 and 330 so that they are closer together. In this example, truss 123 is also modified to maintain an attachment to columns 320 and 330.

At steps 620, 630, and 640, the CAD application may be configured to modify the truss, based on the particular modification performed at step 610. In one embodiment, steps 620, 630, and 640 may be performed by truss modification tool 114. At step 620, the centerline of the truss layout is determined. Of course, the modification performed at step 610 may not change the position of the centerline from an original position. For example, the change made to connection point 410 of diagonal web 240 shown in FIG. 4B does not change the position of the centerline of truss 123.

At step 630, the truss layout is regenerated, to account for changes made at step 610. The truss layout 124 may be regenerated for truss 123, creating a new truss pattern based on the selected truss family, the centerline, and the attachment points for the truss being regenerated. At step 640, a new set of structural members according to the layout generated at step 630 may be generated. At step 640, the instance of truss generated at steps 630 and 640 may stored in CAD model 120.

Figure 7:
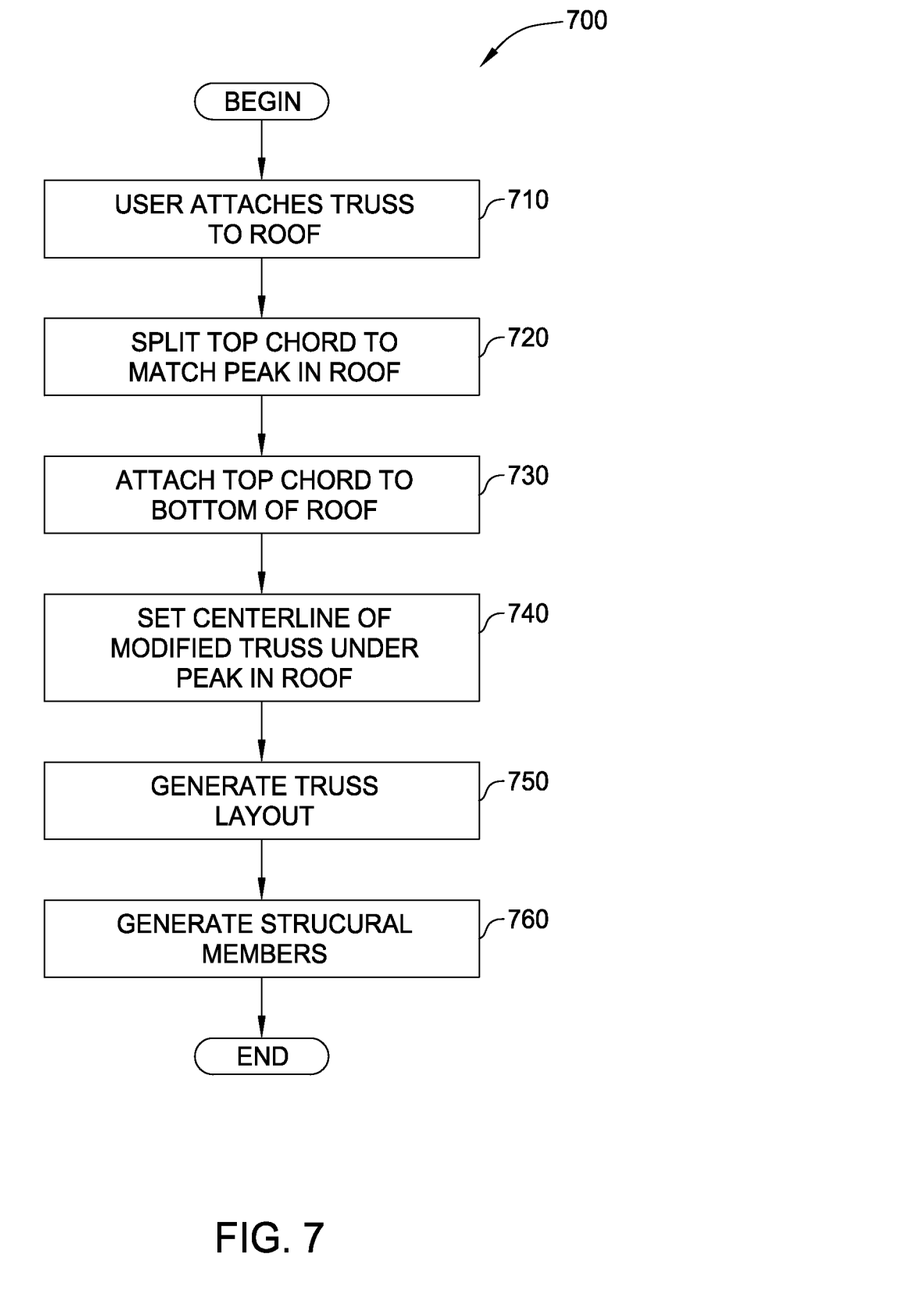
FIG. 7 illustrates a method for attaching a truss to a roof object of a CAD model, according to one embodiment of the invention.

FIG. 7 illustrates a method 700 for attaching a truss to an existing drawing element or object, such as the roof 420 shown in FIG. 4C, according to one embodiment of the invention. Persons skilled in the art will understand that, even though the method is described in conjunction with the systems of FIGS. 1-4, any system configured to perform the steps of method 700, in any order, is within the scope of the present invention.

As shown, method 700 begins at step 710, where a user of a CAD application attaches a truss to drawing elements or objects representing a roof. For example, FIG. 4C illustrates a user interacting with GUI 110 to attach truss 123 to the bottom of roof 420. In response, at steps 720, 730, 740, 750, and 760, the CAD application may be configured to attach the truss to the roof. In one embodiment, steps 720, 730, 740, 750, and 760 may be performed by truss attachment tool 116.

At step 720, the top chord of the truss is modified to conform to the shape of the roof. If the roof has a single peak (as is common), then the top chord of the truss may be split into two structural members, one for each side of the roof. For example, FIG. 4C illustrates two structural members 221 and 222 generated to conform to the angle, length and position of roof peak 425, allowing the top chord to fit underneath the roof without any gaps. Thus, roof 420 is evenly supported along the length of truss 123. At step 730, the top chord of the truss is attached to the bottom of the roof. In one embodiment, the attachment is reflected in CAD model 120 as an attached object 127. That is, the attachment may be stored in CAD model 120 as association between one of trusses 123 and the drawing elements or objects representing roof 420.

At step 740, the centerline of the truss layout is determined, based on the position and geometry of the roof object being attached to the truss. For example, drawing elements representing a roof may include a roof peak that is not located in the center of the roof (i.e., where the roof is asymmetrical). In such cases, a truss layout may be generated with the centerline placed underneath the roof peak and to include a vertical web at the centerline. Of course, depending on the geometry of the roof to which the truss is attached and the particular truss layout, the centerline may be determined to be the same as the original centerline. At step 750, the truss layout is regenerated, taking into account the roof attachment and the centerline determined in step 740. Depending on the particular CAD model 120, in some cases, vertical webs 250 and diagonal webs 240 may need to be extended to match the shape of top chord 220. At step 750, the structural members of the truss are regenerated, based on the layout generated at step 740. For example, FIG. 4C illustrates structural members created for the regenerated truss layout, resulting in truss 123 attached to roof 420. Note, however, while the example discussed in relation to method 700 is directed to a roof having a single peak, embodiments of the invention may be adapted for use with truss objects being attached to drawing elements or objects representing a roof having multiple peaks.

Advantageously, embodiments of the invention may be used to generate interactive truss objects stored within a CAD model. In one embodiment, a truss creation tool allows the user to select a truss family and the endpoints of the truss. Based on these selections, the truss creation tool may generate a layout and a set of structural members for the truss. The layout defines pattern for a given truss based on a given family and elements of a given CAD model. The truss may be maintained as an interactive object in the CAD model. Thus, a user may modify parameters of the truss object, resulting in the regeneration of the truss layout and the regeneration of the structural elements of the truss. Additionally, the endpoints of the truss may be attached to objects of the CAD model, such that changes to the attached objects may cause the truss to be regenerated to conform to the changes. In a particular embodiment, the truss may be attached to a roof object of the CAD model, such that the top chord of the truss conforms to the shape of the roof, and the truss layout is modified so that a top chord of the truss is attached to the bottom of the roof within the CAD model.

While the forgoing is directed to embodiments of the present invention, other and further embodiments of the invention may be devised without departing from the basic scope thereof, and the scope thereof is determined by the claims that follow.

What is claimed is:

1. A method for generating a truss object for a computer-aided design (CAD) model, the method comprising:
   receiving a selection of a truss family for the truss object, wherein the truss family specifies a plurality of components that include a top chord, a bottom chord, one or more vertical webs, and one or more diagonal webs, and, for each component, a geometry of the component and an arrangement of the component relative to a centerline axis;
   receiving a selection of a beginning point and an ending point within the CAD model at which to place the truss object, wherein the beginning point is coupled to a first object, and the ending point is coupled to a second object, and wherein the truss object is coupled to both the first object and the second object;
   determining, based on the selected truss family, the beginning point and the ending point, a centerline for a layout of the truss object that provides an axis for orienting the geometry of the truss object;
   generating a layout for the truss object based on the beginning point, the ending point and the centerline for the layout, wherein the layout defines a pattern for the truss object;
   generating a plurality of structural members to represent physical components of the truss object within the CAD model, wherein each structural member of the plurality of structural members corresponds to a different component specified by the truss family and is positioned within the CAD model according to the layout generated for the truss object and the geometry and the arrangement of the corresponding component specified by the truss family;
   associating the truss layout and the plurality of structural members with the truss object;
   storing the truss object in the CAD model;
   receiving an instruction to move the first object to a new position with respect to the second object; and
   modifying the truss object in accordance with the new position of the first object, to maintain the coupling of the truss object to both the first object and the second object.

2. The method of claim 1, wherein the truss object is editable by a user of a CAD application, and wherein the editing of the truss object causes the CAD application to regenerate the layout and the plurality of structural members for the truss object to reflect the editing of the truss object.

3. The method of claim 1, wherein the truss object is further associated with a set of instance properties, including a height, a length, a position, and an orientation of the truss object within the CAD model.

4. The method of claim 1, wherein the truss family includes one or more properties for truss objects of that family, and wherein a modification to one of the properties causes a CAD application to modify any truss objects in the CAD model that were generated based upon that truss family to reflect the modification to one of the properties.

5. The method of claim 4, wherein the one or more properties for the truss family include a height, a length, a position, and an orientation for truss objects generated according to that truss family.

6. The method of claim 1, further comprising:
   receiving a selection of an object of the CAD model to which the truss object is to be attached; and
   creating an attachment between the truss object to the selected object, wherein the attachment is stored in the CAD model as an association between the truss object and the selected object of the CAD model.

7. The method of claim 6, further comprising:
receiving a modification to the selected object of the CAD model; and
regenerating the layout and the plurality of structural members for the truss object to reflect the modification of the object of the CAD model attached to the truss object.

8. The method of claim 6, wherein the selected object is a drawing object representing a roof, and wherein the step of attaching the truss object to the selected object comprises:
modifying a top chord of the truss object to conform to a shape of the drawing object representing the roof;
attaching the top chord to a bottom of the drawing object representing the roof;
determining a centerline of the truss layout based on the modified top chord;
generating a second truss layout to reflect the attachment to the drawing object representing the roof and a new centerline; and
generating a second plurality of structural members of the truss object according to the new truss layout.

9. The method of claim 1, wherein the plurality of structural members include drawing objects representing a top chord, a bottom chord, one or more vertical members and one or more diagonal members.

10. The method of claim 1, wherein the instruction to move the first object to the new position is an instruction to move the first object closer to the second object and modifying the truss object further comprises changing the width of panels included in the truss object to maintain a specific number of panels.

11. A non-transitory computer-readable storage medium storing instructions that when executed by a processor cause the processor to generate a object for a computer-aided design (CAD) model by performing the steps of:
receiving a selection of a truss family for the truss object, wherein the truss family specifies a plurality of components that include a top chord, a bottom chord, one or more vertical webs, and one or more diagonal webs, and for each component, a geometry of the component and an arrangement of the component relative to a centerline axis;
receiving a selection of a beginning point and an ending point within the CAD model at which to place the object, wherein the beginning point is coupled to a first object, and the ending point is coupled to a second object, and wherein the truss object is coupled to both the first object and the second object;
determining, based on the selected truss family, the beginning point, and the ending point, a centerline for a layout of the truss object that provides an axis for orienting the geometry of the truss object;
generating a layout for the object based on the selected truss family, the beginning point, the ending point, and the centerline for the layout, wherein the layout defines a pattern for the object;
generating a plurality of structural members to represent physical components within the CAD model, wherein the plurality of structural members are positioned within the CAD model, wherein each structural member of the plurality of structural members corresponds to a different component specified by the truss family and according to the layout generated for the object and the geometry and the arrangement of the corresponding component specified by the truss family;
associating the layout and the plurality of structural members with the object;
storing the object in the CAD model;
receiving an instruction to move the first object to a new position with respect to the second object; and
modifying the truss object in accordance with the new position of the first object, to maintain the coupling of the truss object to both the first object and the second object.

12. The non-transitory computer-readable storage medium of claim 11, wherein the truss object is editable by a user of a CAD application, and wherein the editing of the truss object causes the CAD application to regenerate the layout and the plurality of structural members for the truss object to reflect the editing of the truss object.

13. The non-transitory computer-readable storage medium of claim 11, wherein the truss object is further associated with a set of instance properties, including a height, a length, a position, and an orientation of the truss object within the CAD model.

14. The non-transitory computer-readable storage medium of claim 11, wherein the truss family includes one or more properties for truss objects of that family, and wherein a modification to one of the properties causes a CAD application to modify any truss objects in the CAD model that were generated based upon that truss family to reflect the modification to one of the properties.

15. The non-transitory computer-readable storage medium of claim 14, wherein the one or more properties for the truss family include a height, a length, a position, and an orientation for truss objects generated according to that truss family.

16. The non-transitory computer-readable storage medium of claim 11, wherein the instructions further comprise instructions for:
receiving a selection of an object of the CAD model; and
creating an attachment between the truss object is to be attached to the selected object wherein the attachment is stored in the CAD model as an association between the truss object and the selected object of the CAD model.

17. The non-transitory computer-readable storage medium of claim 16, wherein the instructions further comprise instructions for:
receiving a modification to the selected object of the CAD model; and
regenerating the layout and the plurality of structural members for the truss object to reflect the modification of the object of the CAD model attached to the truss object.

18. The non-transitory computer-readable storage medium of claim 16, wherein the selected object is a drawing object representing a roof, and wherein the instructions for attaching the truss object to the selected object further comprise:
modifying a top chord of the truss object to conform to a shape of the drawing object representing the roof;
attaching the top chord to a bottom of the drawing object representing the roof;
determining a centerline of the truss layout based on the modified top chord;
generating a second truss layout to reflect the attachment to the drawing object representing the roof and a new centerline; and
generating a second plurality of structural members of the truss object according to the new truss layout.

19. The non-transitory computer-readable storage medium of claim 11, wherein the plurality of structural members include drawing objects representing a top chord, a bottom chord, one or more vertical members and one or more diagonal members.

20. A method for generating a truss object for a computer-aided design (CAD) model, the method comprising:
  selecting a truss family for the truss object, wherein the truss family specifies a plurality of components that include a top chord, a bottom chord, one or more vertical webs, and one or more diagonal webs, and, for each component, a geometry of the component and an arrangement of the component relative to a centerline axis;
  selecting a beginning point and an ending point within the CAD model at which to place the truss object, wherein the beginning point is coupled to a first object, and the ending point is coupled to a second object, and wherein the truss object is coupled to both the first object and the second object;
  invoking a truss creation tool provided by a CAD application, wherein the truss creation tool is configured to:
    determine, based on the selected truss family, the beginning point and the ending point, a centerline for a layout of the truss object that provides an axis for orienting the geometry of the truss object;
    generate a layout for the truss object based on the selected truss family, the beginning point, the ending point and the centerline for the layout, wherein the layout defines a pattern for the truss object;
    generate a plurality of structural members to represent physical components of the truss object within the CAD model, wherein each structural member of the plurality of structural members corresponds to a different component specified by the truss family and is positioned within the CAD model according to the layout generated for the truss object and the geometry and the arrangement of the corresponding component specified by the truss family;
    associate the truss layout and the plurality of structural members with the truss object;
    store the truss object in the CAD model;
    receive an instruction to move the first object to a new position with respect to the second object; and
    modify the truss object in accordance with the new position of the first object, to maintain the coupling of the truss object to both the first object and the second object.

21. The method of claim 20, wherein the truss object is editable by a user of the CAD application, and wherein the editing of the truss object causes the CAD application to regenerate the layout and the plurality of structural members for the truss object to reflect the editing of the truss object.

22. The method of claim 20, wherein the truss object is further associated with a set of instance properties, including a height, a length, a position, and an orientation of the truss object within the CAD model.

23. The method of claim 20, wherein the truss family includes one or more properties for truss objects of that family, and wherein a modification to one of the properties causes the CAD application to modify any truss objects in the CAD model that were generated based upon that truss family to reflect the modification to one of the properties.

24. The method of claim 23, wherein the one or more properties for the truss family include a height, a length, a position, and an orientation for truss objects generated according to that truss family.

25. The method of claim 20, further comprising selecting an object of the CAD model to which the truss object is to be attached, and wherein the CAD application is further configured to create an attachment between the truss object to the selected object, wherein the attachment is stored in the CAD model as an association between the truss object and the selected object of the CAD model.

26. The method of claim 25, further comprising:
  modifying the selected object of the CAD model, wherein the CAD application is further configured to regenerate the layout and the plurality of structural members for the truss object to reflect the modification of the object of the CAD model attached to the truss object.

27. The method of claim 25, wherein the selected object is a drawing object representing a roof, and wherein the CAD application is further configured to:
  modify a top chord of the truss object to conform to a shape of the drawing object representing the roof;
  attach the top chord to a bottom of the drawing object representing the roof;
  determine a centerline of the truss layout based on the modified top chord;
  generate a second truss layout to reflect the attachment to the drawing object representing the roof and a new centerline; and
  generate a second plurality of structural members of the truss object according to the new truss layout.

28. The method of claim 20, wherein the plurality of structural members include drawing objects representing a top chord, a bottom chord, one or more vertical members and one or more diagonal members.

* * * * *

UNITED STATES PATENT AND TRADEMARK OFFICE
CERTIFICATE OF CORRECTION

| | |
|---|---|
| PATENT NO. | : 8,762,110 B2 |
| APPLICATION NO. | : 11/696070 |
| DATED | : June 24, 2014 |
| INVENTOR(S) | : Egbertson et al. |

It is certified that error appears in the above-identified patent and that said Letters Patent is hereby corrected as shown below:

Claims:

Column 11, Claim 11, Line 36, insert --truss-- before object;
Column 11, Claim 11, Line 46, insert --truss-- before object;
Column 11, Claim 11, Line 55, insert --truss-- before object;
Column 11, Claim 11, Line 58, insert --truss-- before object;

Column 11, Claim 11, Lines 59-67, delete "generating a plurality of structural members to represent physical components within the CAD model, wherein the plurality of structural members are positioned within the CAD model, wherein each structural member of the plurality of structural members corresponds to a different component specified by the truss family and according to the layout generated for the object and the geometry and the arrangement of the corresponding component specified by the truss family;"
and insert --generating a plurality of structural members to represent physical components of the truss object within the CAD model, wherein each structural member of the plurality of structural members corresponds to a different component specified by the truss family and is positioned within the CAD model according to the layout generated for the truss object and the geometry and the arrangement of the corresponding component specified by the truss family;-- therefor;

Column 12, Claim 11, Line 1, insert --truss-- before layout;
Column 12, Claim 11, Line 2, insert --truss-- before object;
Column 12, Claim 11, Line 3, insert --truss-- before object;
Column 12, Claim 16, Line 35, insert --to which the truss object is to be attached-- after model;
Column 12, Claim 16, Lines 36-37, delete "is to be attached";
Column 12, Claim 16, Line 37, insert --,-- after object.

Signed and Sealed this
Sixth Day of January, 2015

Michelle K. Lee
*Deputy Director of the United States Patent and Trademark Office*